United States Patent [19]
Lee et al.

[11] Patent Number: 6,165,879
[45] Date of Patent: Dec. 26, 2000

[54] METHOD FOR IMPROVING MANUFACTURING PROCESS OF SELF-ALIGNED CONTACT

[75] Inventors: Tzung-Han Lee, Taipei; Hsi-Chien Lin, Feng-Yuan, both of Taiwan

[73] Assignee: United Microelectronics Corp., Hsin-Chu, Taiwan

[21] Appl. No.: 09/426,979

[22] Filed: Oct. 26, 1999

[51] Int. Cl.[7] .............................................. H01L 21/3205
[52] U.S. Cl. .................... 438/586; 438/585; 438/584; 257/202; 257/303
[58] Field of Search .................. 438/585, 584, 438/586; 257/202, 303

[56] References Cited

U.S. PATENT DOCUMENTS

| | | | |
|---|---|---|---|
| 5,019,525 | 7/1990 | Virkus et al. | 437/32 |
| 5,104,822 | 4/1992 | Butler | 437/52 |
| 5,612,240 | 6/1996 | Chang | 437/44 |
| 5,888,897 | 3/1999 | Liang | 438/622 |
| 6,015,730 | 3/1998 | Wang et al. | 438/241 |

*Primary Examiner*—Matthew Smith
*Assistant Examiner*—Grammill D Lee
*Attorney, Agent, or Firm*—Harness, Dickey & Pierce, P.L.C.

[57] ABSTRACT

The invention is related to a method for increasing margin precision of a self-aligned contact. A semiconductor has at least a gate electrode and source/drain, and a gate spacer is formed on the sidewall of the gate electrode. A first silicon oxide layer is then formed on the semiconductor substrate. A hard mask layer is formed on the first silicon oxide layer. A second silicon oxide layer is then deposited over the hard mask layer. A chemical mechanical polishing is then performed to remove the second silicon oxide layer so that the hard mask layer is planarized. Thereafter, the hard mask layer and the first silicon oxide layer is etched to form a gap region on the first silicon oxide layer. A polysilicon layer is then deposited over the entire substrate including the gap region and the hard mask layer. Thereafter, the polysilicon layer is etched back to form a polysilicon spacer. Finally, the gap region of the first silicon oxide layer is etched to form a self-aligned contact.

18 Claims, 4 Drawing Sheets

METHOD FOR IMPROVING MANUFACTURING PROCESS OF SELF-ALIGNED CONTACT

BACKGROUND OF THE INVENTION

1. Field of the Invention

This invention proposes a high margin precision manufacturing method for a self-aligned contact. More specifically, this invention relates to a manufacturing process for a self-aligned contact in which a hard mask layer and a polysilicon spacer are formed so as to increase the margin and precision of self-aligned etching. Therefore, the misalignment problem derived from the increasing density of the transistor devices can be overcome.

2. Description of the Prior Art

The area of a MOS device is increasingly reduced in synchronization with the development of the semiconductor integrated circuit. Although reduction of the length of the gate electrode improves the performance and the speed of processor or dynamic random access memory (DRAM), the RC (i.e., resistor times capacitor) delay time of the conductive connection becomes longer. The transfer time of the gate electrode is far larger than the RC delay time of conductive connection before the micron devices are developed. With the development of VLSI, the transfer time of the gate electrode is approximately equal to the RC delay time of conductive connection. Therefore, the application of the multi-layered conductive line to reduce the length of the conductive line is unavoidable, and hence the resistance is reduced. This goal is easily achieved while the line width is far larger than the thickness of metal film. However, it is impossible to achieve this goal without developing other manufacturing processes when line width with a micron grade is developed.

DRAM is a major volatile memory. Because the integration requirement of the semiconductor devices is increasingly higher, the combination of logic and DRAM is widely applied to wafers, and the bit-line contact and the node contact are both designed to be self-aligned contacts (SAC) so as to reduce the size of the wafer.

Because of the shrinkage of the size and line width of MOS and metal line, portions of the metal line may contact the shallow trench isolation (STI) when the size of the source or drain region is smaller than the width of metal line, or when the misalignment occurs between source region or drain region and metal line.

By utilizing the conventional method of manufacturing the contact, the number of problems to be overcome is increased accompanied by the increased integration of the transistor devices. These problems occur easily and are illustrated in FIGS. 1 and 2. As shown in FIG. 1, a silicon substrate 10 is first provided, the silicon substrate 10 includes a metal-oxide semiconductor (MOS) structure formed thereon, wherein the MOS structure is composed of a gate electrode 14 and a source/drain region 12. The gate (electrode 14 is further composed of a polysilicon layer 16, a silicide layer 18, and silicon nitride layer 20, and a gate spacer 22 is formed on the sidewall of the gate electrode 14. Since the circuit integration is increased, the aspect ratio is increased accompanied by the reduction of contact size. Because the covering rate of the contact bottom is decreased, the inter-poly dielectric layer 24 cannot entirely fill the contact gaps and a void 26 is unavoidably formed in the contact and the subsequent processes are affected. In addition, the increasing of the devices integration also results in the misalignment a contact, as shown in FIG. 2, and a short circuit phenomenon therefore is produced due to the over-etching in the etch margin.

SUMMARY OF THE INVENTION

A primary object of the invention is to provide a self-aligned contact with good profile and to increase the alignment margin in the self-aligned contact (SAC) formation, so that the problems derived from the misalignment of SAC etching, which is accompanied by the increased MOS device integration, are overcome.

A concrete object of the invention is to protect the gate electrode spacer with a polysilicon spacer and to prevent the contact formation process from over-etching; a short circuit is thereby prevented.

An additional object of the invention is to smoothly fill the contact gaps with a low dielectric constant material, for example, salicide or tungsten silicide, during the gap filling process so as to reduce the resistance of the contact.

The invention disclosed herein is related to a method for increasing margin precision of a self-aligned contact. The proposed method comprises providing a semiconductor substrate, the semiconductor having at least a gate electrode and source/drain. A gate spacer is formed on the sidewall of gate electrode. A first silicon oxide layer is then formed on the semiconductor substrate. A hard mask layer is formed on the first silicon oxide layer. A second silicon oxide layer is then deposited over the hard mask layer. A chemical mechanical polishing is then performed to remove the second silicon oxide layer so that the hard mask layer is planarized. Thereafter, the hard mask layer and the first silicon oxide layer are etched to form a gap region on the first silicon oxide layer. A polysilicon layer is then deposited over the entire substrate including the gap region and the hard mask layer. Thereafter, the polysilicon layer is etched back to form a polysilicon spacer. Finally, the gap region of 1-he first silicon oxide layer is etched to form a self-aligned contact.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The content of the proposed invention can be explained and understood by following embodiments with corresponding figures. FIGS. 3A to 3F are cross-sectional views showing a method for forming a self-aligned contact having high margin precision in accordance with one embodiment of the present invention.

Figure 1:
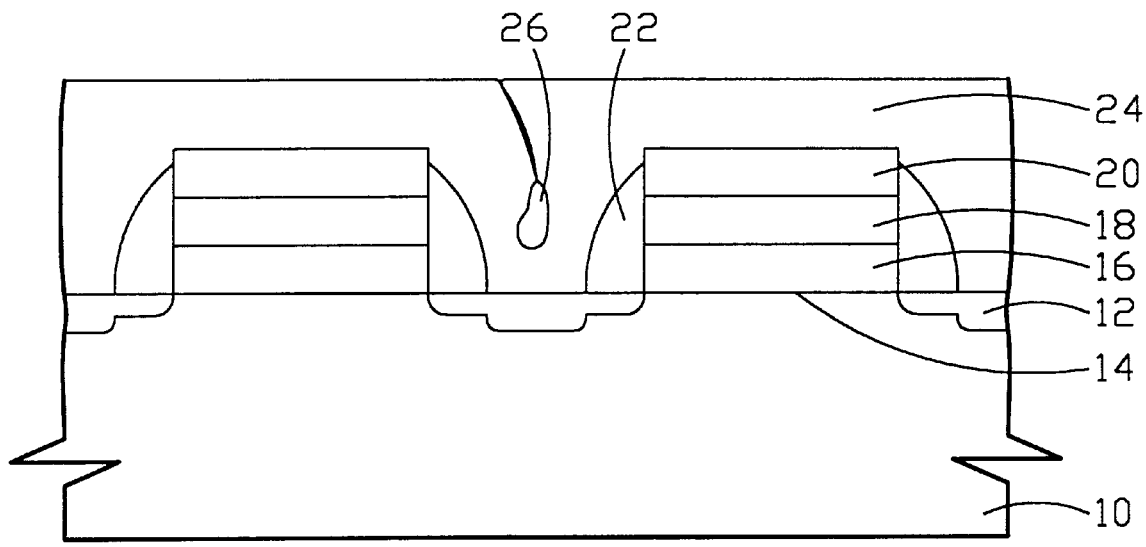
FIG. 1 is a cross-sectional view showing a conventional manufacturing method of MOS, wherein voids are formed in the formation step of the inter-poly dielectric layer.
Figure 2:
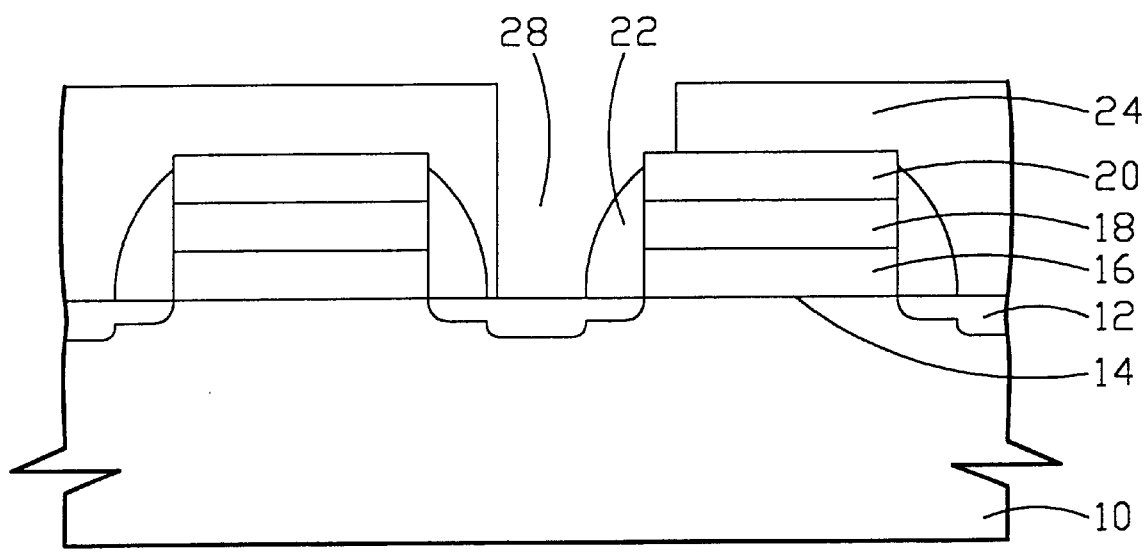
FIG. 2 is a cross-sectional view showing a conventional manufacturing method of MOS, wherein a misaligned contact is formed.
Figure 3A:
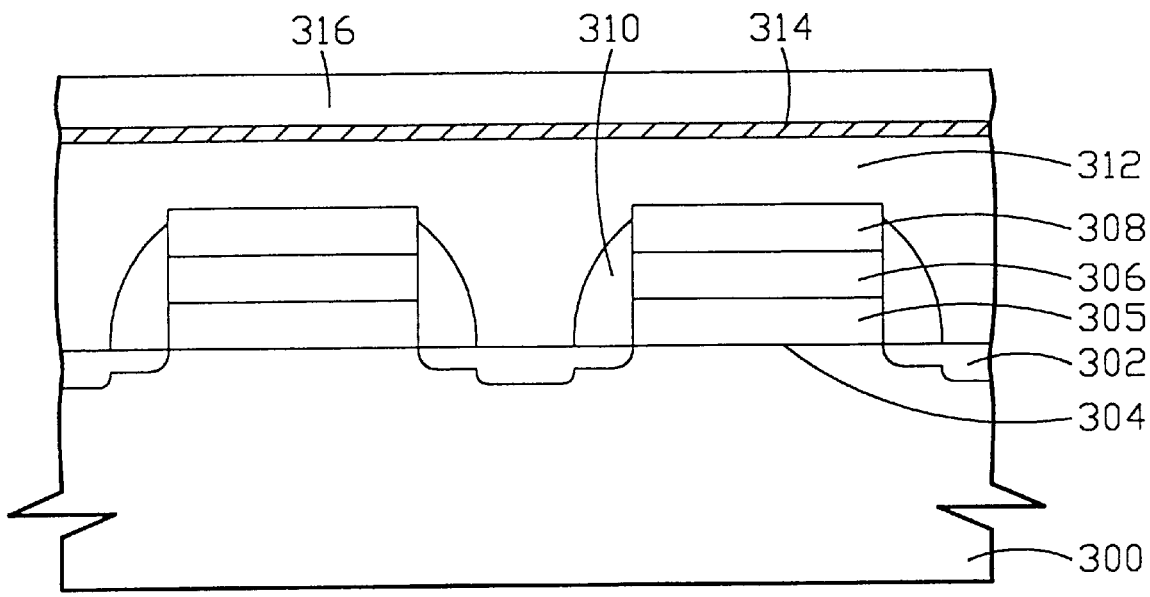
FIGS. 3A to 3F are cross-sectional views showing a method for forming a self-aligned contact in accordance with one embodiment of the present invention.

As shown in FIG. 3A, a silicon substrate 300 having a metal-oxide semiconductor (MOS) structure formed thereon is provided, wherein the MOS structure includes gate electrode 304, which is composed of polysilicon layer 305, silicide layer 306 and silicon nitride layer 308, and source/drain region 302. Additionally, a gate spacer 310 is formed on the sidewall of the gate electrode 304. First of all, a silicon oxide layer 312 is formed over the entire MOS structure. Thereafter, a hard mask layer 314, for example, silicon nitride or silicon oxynitride material, is formed on the silicon oxide layer 312 to a thickness of about 300 to 8000 Å by a oxide CVD method. In addition, a silicon oxide layer 316 is formed on the hard mask layer 314. The silicon oxide layer 316 is served as a sacrificial layer and is widely used to enhance the planarization of the hard mask layer 314.

Figure 3B:
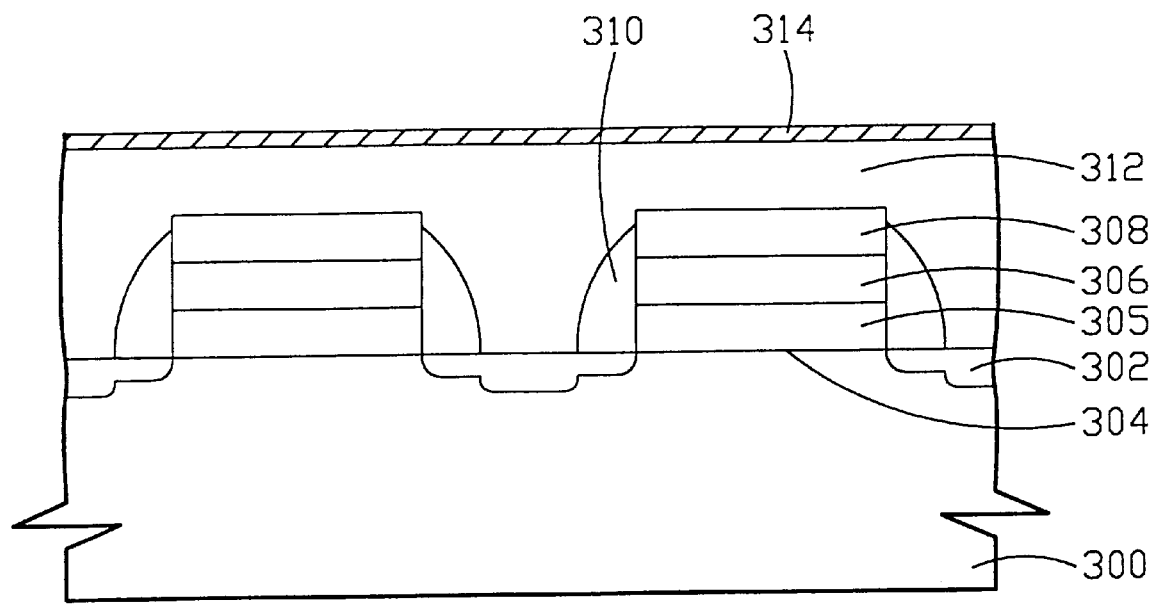
Figure 3C:
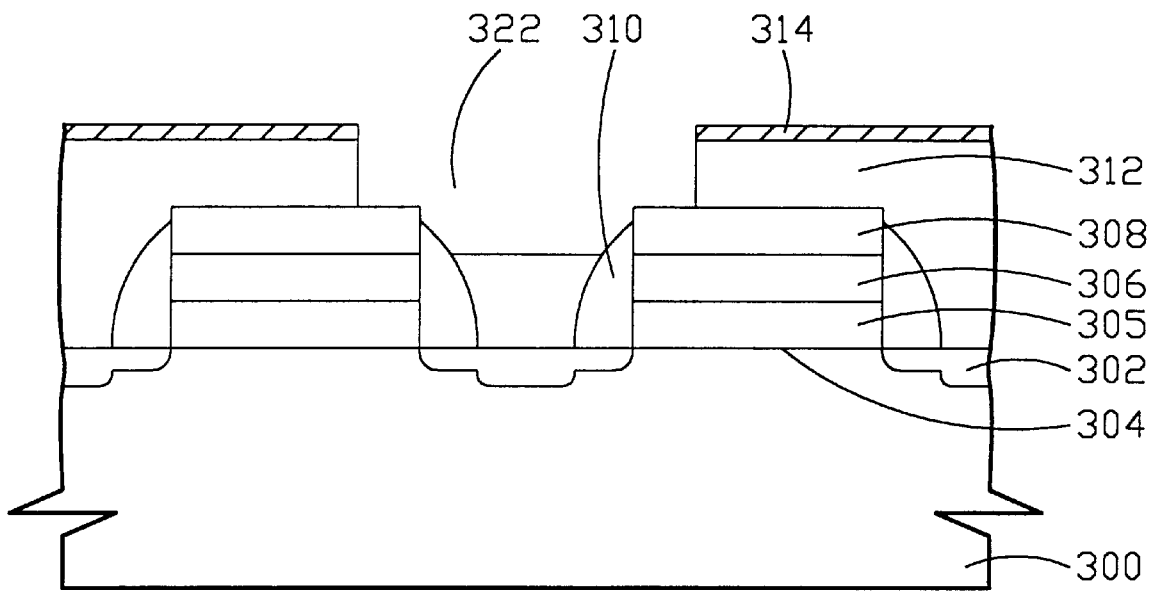

The silicon oxide layer 316 is then removed by chemical mechanical polishing. Because of the inherent properties of different materials, the polishing step is stopped on the hard mask layer and the surface of the hard mask layer is further planarized, as shown in FIG. 3B. Thereafter, the hard mask layer 314 and the silicon oxide layer 312, which are located on a position between two adjacent gate electrodes, rare etched by anisotropic dry etching. However, the hard mask layer and the silicon oxide layer are merely partially etched to form a silicon oxide layer 312 having a gap region 322, namely, the silicon substrate is not exposed in this etching step. The gap region 322 of the silicon oxide layer 312 partially exposes both the sidewall of the gate electrode and the sidewall of the gate spacer, as shown in FIG. 3C.

Figure 3D:
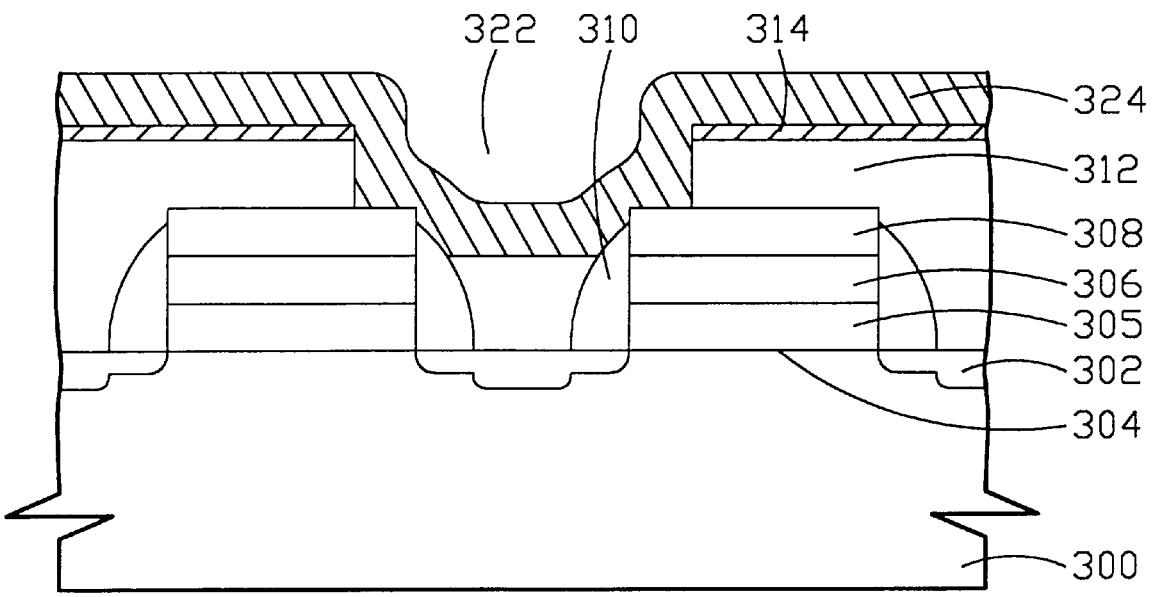
Figure 3E:
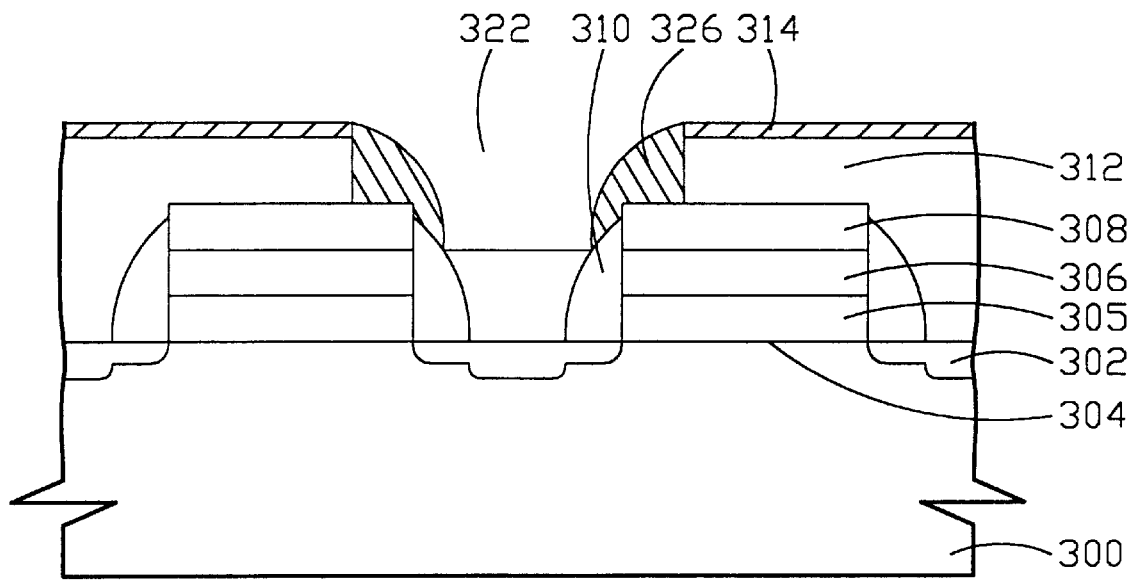
Figure 3F:
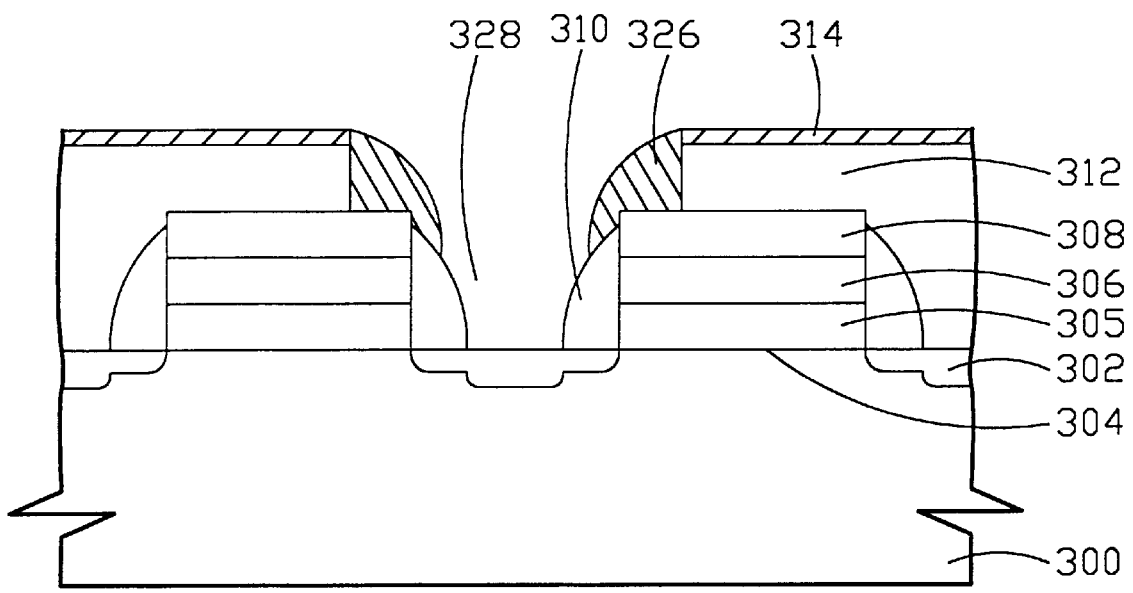

Thereafter, a polysilicon layer 324 is formed by conventional furnace deposition to a thickness of about 200 to 5000 Å and over the entire MOS structure, including the gap region, as shown in FIG. 3D. The MOS devices is then moved into a dry etching machine, and a process, for example, a spacer etching, is performed so that a polysilicon spacer 326 is formed on the sidewall of the gate electrode within the gap region. The polysilicon spacer further protects the sidewall of the gate electrode and the charging effect is therefore avoided. Finally, a self-aligned contact 328 is then formed by performing an etching step, as shown in FIG. 3F.

While the invention has been described by these embodiments, the invention is not limited thereto. To the contrary, it is intended to cover various modifications, procedures and products. The scope of the appended claims therefore should be accorded the broadest interpretation so as to encompass all such modifications and similar arrangement, procedures and products.

What is claimed is:

1. A method for forming a self-aligned contact, comprising:

providing a semiconductor substrate having at least a gate electrode and a source/drain region, with a first spacer formed on a sidewall of the semiconductor substrate;

depositing a first insulation layer over the semiconductor substrate;

forming a hard mask layer on the first insulation layer;

depositing a second insulation layer over the hard mask layer;

removing the second insulation layer;

etching the hard mask layer and the first insulation layer until a portion of the first spacer is exposed to form a gap region, whereby the first insulation remains between the first spacers;

depositing a conductive layer over the gap region and the hard mask layer;

etching back the conductive layer to form a second spacer; and etching the first insulation layer until a surface of the semiconductor substrate is exposed to form a self-aligned contact.

2. The method according to claim 1, wherein said semiconductor substrate includes at least silicon.

3. The method according to claim 1, wherein said first spacer is a gate electrode spacer.

4. The method according to claim 1, wherein said first insulation layer is a silicon oxide layer.

5. The method according to claim 1, wherein said second insulation layer is a silicon oxide layer.

6. The method according to claim 1, wherein said hard mask layer includes a silicon oxynitride layer.

7. The method according to claim 1, wherein said hard mask layer includes silicon nitride.

8. The method according to claim 1, wherein said conductive layer includes a polysilicon layer.

9. The method according to claim 1, wherein said step of removing the second insulation layer is performed by chemical mechanical polishing so that the hard mask layer is planarized.

10. The method according to claim 1, wherein said second spacer includes a polysilicon spacer.

11. A method for increasing a margin and a precision of a self-aligned contact, comprising:

providing a semiconductor substrate having at least a gate electrode and a source/drain region, with a gate spacer formed on a sidewall of the semiconductor substrate;

depositing a first silicon oxide layer over the semiconductor substrate;

forming a hard mask layer on the first silicon oxide layer;

depositing a second silicon oxide layer over the hard mask layer;

performing a chemical mechanical polishing to remove a second insulation layer and to planarize the hard mask layer;

etching the hard mask layer and the first silicon oxide layer to form a gap region of the first silicon oxide layer, whereby the first silicon oxide layer remains between the first spacers;

depositing a polysilicon layer over the semiconductor substrate and above the gap region and the hard mask layer;

etching back the polysilicon layer to form a polysilicon spacer; and etching the gap region of the first silicon oxide layer to form a self-aligned contact.

12. The method according to claim 11, wherein said semiconductor substrate includes at least silicon.

13. The method according to claim 11, wherein said hard mask layer includes silicon oxynitride.

14. The method according to claim 11, wherein said hard mask layer includes silicon nitride.

15. The method according to claim 11, wherein said second silicon oxide layer is used as sacrificial layer.

16. The method according to claim 11, wherein said gap region exposes a portion of the sidewall of a gate electrode and a portion of the gate spacer.

17. The method according to claim 11, wherein said polysilicon spacer is formed by anisotropic dry etching.

18. The method according to claim 11, wherein said polysilicon spacer is formed on the gap region.

* * * * *